United States Patent [19]

Onishi et al.

[11] Patent Number: 4,506,109

[45] Date of Patent: Mar. 19, 1985

[54] AL-STABILIZED SUPERCONDUCTING WIRE AND THE METHOD FOR PRODUCING THE SAME

[75] Inventors: Toshitada Onishi; Hiroshi Tateishi; Kenichi Koyama, all of Niiharu; Shigeo Saito; Masayuki Nagata, both of Osaka, all of Japan

[73] Assignees: Agency of Ind. Science and Technology; Sumitomo Electric, both of Osaka, Japan

[21] Appl. No.: 382,363

[22] Filed: May 26, 1982

[30] Foreign Application Priority Data

May 28, 1981 [JP] Japan .................................. 56-81759
May 28, 1981 [JP] Japan .................................. 56-81760

[51] Int. Cl.³ ............................................. H01B 12/00
[52] U.S. Cl. .................................. 174/128 S; 29/599; 174/126 S
[58] Field of Search ............... 174/15 S, 126 S, 128 S; 29/599

[56] References Cited

U.S. PATENT DOCUMENTS

| | | | |
|---|---|---|---|
| 3,428,926 | 2/1969 | Bogner et al. | 174/128 S |
| 3,596,349 | 8/1971 | Boom | 174/128 S |
| 3,708,606 | 1/1973 | Shattes et al. | 174/126 S X |
| 3,743,986 | 7/1973 | McInturff et al. | 29/599 X |
| 3,767,842 | 10/1973 | Bronca et al. | 174/128 S |
| 3,983,521 | 9/1976 | Furuto et al. | 174/126 S X |
| 4,336,420 | 6/1982 | Benz | 174/128 S |

OTHER PUBLICATIONS

Tsuei, C. C.; "Superconducting Cu-Rich Wires Containing Nb-Ti or NbZr", IBM Technical Disclosure Bulletin, vol. 18, No. 4, 9/75.
Onishi, T. et al.; Fabrication of Cryostable, Low-Loss Cable for a 3.8 MJ Pulsed Superconducting Coil; Conference, 9th Symposium on Engineering Problems of Fusion Research, Chicago, Ill., USA, Oct. 26–29, 1981.

*Primary Examiner*—Richard L. Moses
*Assistant Examiner*—Morris H. Nimmo
*Attorney, Agent, or Firm*—Wenderoth, Lind & Ponack

[57] ABSTRACT

The invention relates an Al-stabilized superconducting wire for use in a superconducting magnet used in a charging magnetic field, such as a pulse magnet and the like, and particularly to an Al-stabilized superconducting wire having the properties of reduced size and light weight, high current density, high stability, low AC loss, etc., and a method for producing the same. The said Al-stabilized superconducting wire has a core chosen from a superconducting elementary wire, an electrically insulated Cu or a Cu alloy, or a nonmagnetic metal or alloys thereof, and wherein the superconducting elementary wires and high purity Al wires are alternately stranded around said core. The stranded cable is bonded by impregnating it with solder, or further by subjecting it to a reduction process and heat treatment thereby making it possible to obtain an aluminum stabilized superconducting wire having said high properties.

6 Claims, 10 Drawing Figures

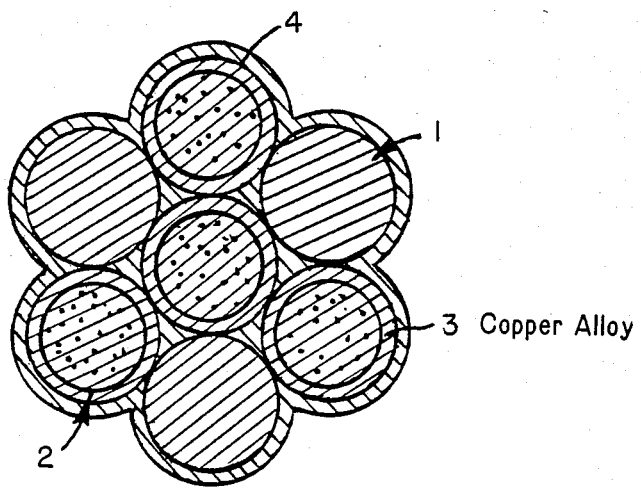
FIG. 5
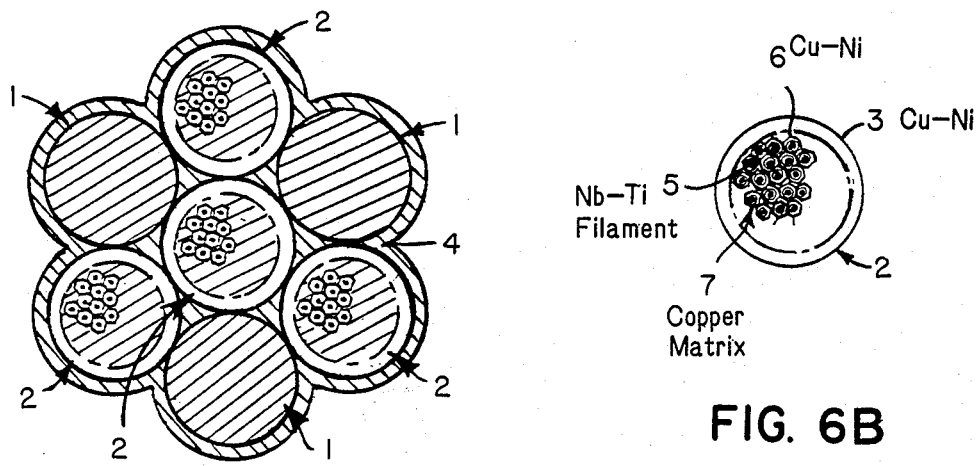
FIG. 6A
FIG. 6B

AL-STABILIZED SUPERCONDUCTING WIRE AND THE METHOD FOR PRODUCING THE SAME

The invention relates to an aluminum stabilized (hereinafter Al-stabilized) superconducting wire of smaller size and lighter weight, a higher current deensity, a greater stability and a lower AC loss, and particularly to a wire for use in a superconducting magnet employed in a charging magnetic field, such as pulse a magnet and the like, and a method for producing the same.

Superconducting material presently for use in superconducting magnetic wires comprise alloys, such as Nb-Ti, Nb-Zr, etc., and intermetallic compounds, such as $Nb_3Sn$, $V_3Ga$, etc.

Generally, these materials are used with a stabilizer in in conjunction with high purity Cu or high purity Al.

With the development and practical use of superconducting magnets in recent years, demand has increased for a wire of smaller size and lighter weight, higher a current density, a higher stability, and a lower AC loss, particularly when used in a pulse magnet.

In said three features, i.e., a smaller size and a lighter weight, a greater current density and a higher stability, high purity Al is particularly effective as a stabilizer because of its low density which is less than $\frac{1}{3}$ that of high purity Cu, its high electroconductivity at very low temperatures, its high heat conductivity, and its saturation properties in magnetoresistance effect, etc.

It is deemed difficult, however, to directly manufacture or process Al and a superconducting material, as in the case of Cu, since Al is easily covered by an oxidized film and also its mechanical strength is greatly different from that of a superconducting material.

Al and superconducting materials are generally integrated or produced by the following method. High purity Cu and superconducting material are composed, and then Al is integrated with the composite. This method, however, involves no small difficulty, since the higher the purity of Al, the lower the mechanical strength thereof.

Conventionally, therefore, Al was stabilized by one of the following processes:

1. High purity copper and a superconducting material are composed. The composite thus obtained is covered by an intertwisted Al wire and then compressed by means of a roller, a Turk's head roll and the like. The Al wire is caused to adhere to the composite of Cu and superconducting material by making use of differences of the coefficient of thermal expansion at low temperatures between Al and Cu.

2. High purity copper and a superconducting material are composed. Copper-coated Al wires are intertwisted around the composite and soldered thereto.

3. The copper-coated Al wires are intertwisted around a predetermined number of superconducting elementary wires, produced by manufacturing a composite of a high purity copper and superconducting material, and the wires soldered thereto.

That is, high purity Al wires are intertwisted around a composite comprising Cu and a superconducting material (hereinafter referred to as a superconducting elementary wire).

The Al-stabilized superconducting wire produced by these processes are satisfactory as far as said three features are concerned, i.e., small size and light weight, high current density and high stability. The Al-stabilized superconducting wire is not free from difficulties in respect to mechnical strength and AC loss in view of the fact that Al is disposed around the superconducting elementary wire and that a composite of high purity copper and a superconducting material, i.e., a Cu-sleeved superconducting elementary wire, is used.

Thus, when the superconducting wire is used in a charged magnetic field, a loss, generally known as an AC loss, is unavoidable.

The AC loss can be divided into a loss due to the inner structure of the superconducting wire and a loss attributable to the mechanical strength against the electromagnetic force applied to the wire when the superconducting wire is wound into the form of a magnet.

The former loss consists of three components: a hysteresis loss arising in the superconductor (e.g., the NbTi filament itself); a coupling loss due to the electromagnetic coupling arising between the superconductors (e.g., between NbTi filaments and between superconducting elementary wires); and an eddy current loss caused in the normal conductive metal parts (e.g., Cu and Al used as stabilizers).

The former loss conceivably comprises mechanical heat generation and movement of the wound wire caused by a repetitive electromagnetic force in the charging magnetic field.

In the case of using a superconducting wire in a charging magnetic field, the AC loss should be minimized. Thus it is necessary that each of the aforedescribed losses be reduced, for example, by the following processes:

a. To prevent the hysteresis loss, the superconductor is formed into fine multi-cores (in the form of filaments).

b. To prevent the coupling loss, the electromagnetic coupling between the filaments and between the superconducting elementary wires is severed by interposing a high resistance material therebetween.

c. To avoid an eddy current loss, the area of the normal conductive metal part (stabilizing material) is reduced. However, the stabilizing material should have a total area not less than certain predetermined dimensions. In this case, the stabilizing material is not disposed en bloc in the predetermined amount but is divided so that the eventual total area is equal to said amount. Thus the eddy current loss can be reduced. Finally, it is necessary that the stabilizing material be dispersed and disposed around the superconducting elementary wire.

d. To prevent the mechanical heat generation and wire movement, the superconducting wire should have the maximal mechanical strength.

The above-described conventional Al-stabilized superconducting wire has a disadvantageous structure in respect to be mechanical strength and eddy current loss, since the Al is disposed around the superconducting elementary wire. Conventionally, the surface of the superconducting elementary wire was covered by Al which was more susceptible to mechanical deformation and plastic deformation compared with the superconducting elementary wire. Thus the conductivity of the wire was apt to be reduced at low temperatures by said deformation.

Furthermore, the Al is directly subjected to electromagnetic force and the like, thereby making it difficult to satisfactorily maintain the mechanical strength and conductivity at low temperatures.

The Al wire disposed around the superconducting elementary wire, not only in case of the composed process but also in case of intertwisted wire, is in the state of electromagnetic contact with each other. Since Al as stabilizer is disposed continuously (as an integrated whole), it caused the eddy current loss to increase.

The structure is disadvantageous in respect to the coupling current between the superconducting elementary wires because the superconducting wire is a Cu-sleeved superconducting wire having high purity copper as a matrix.

Since the elementary wires are sleeved with Cu, they are electrically in contact with each other with the interposition of a low resistance metal, e.g., Cu, when the superconducting wires are physically in contact with each other and the Cu-Al when the Al wires are interposed between the superconducting elementary wires. Thus a coupling current arises between the superconducting elementary wires thereby resulting in a coupling loss.

In the aforedescribed method of integrating a superconducting wire and a high purity Al wire by intertwisting, the mechanical and electrical contact between the superconducting wires, between the superconducting wire and Al wire, and between the Al wires, is not sufficient when the Al wire and superconducting wire are simply intertwisted with each other, or simply soldered after intertwisting. Thus, the compound wire lacks mechanical strength and stability. It involves the further disadvantage of reduced current density due to considerable clearances left between the elementary wires.

These difficulties can be obviated by a method in which a superconducting wire and an Al wire are intertwisted, reduced and then impregnated with solder by immersion.

When the wires are reduced prior to solder impregnation, adhesion between the elementary wires is improved. Thus the mechanical and electrical contact after solder impregnation is improved, thereby enabling the compound wires to have greater mechanical strength, stability and current density.

This method, however, has the following disadvantage. When Al intertwisted with a superconducting wire has a high purity (above 99.99%), the mechanical strength thereof is reduced, whereby a reduction process after intertwisting is rendered very difficult.

For example, in the case of processing by means of a wire drawing die after intertwisting, the high purity Al in the intertwisted wire is susceptible to breaking, and once breakage occurs, the high purity Al is accumulated at the inlet of the die thereby making it impossible to obtain a smoothly intertwisted wire.

Processing after intertwisting and prior to solder impregnation is practicable if the mechanical strength is increased by reducing the Al purity. This method, however, has a disadvantage in that a reduced Al purity results in a deteriorated conductivity at very low temperatures. Since stability is also reduced, the advantages of Al as stabilizer will be substantially the same as Cu, except that both have light weight characteristics.

The invention has been made with a view to obviating the aforedescribed difficulties. The invention is characterized firstly in that, in an intertwisted wire comprises a superconducting elementary wire and a high purity Al wire serving as stabilizer, and is constructed such that the core of said intertwisted wire is made from a superconducting elementary wire or an electrically insulated nonmagnetic metal with said elementary wires and high purity Al wires alternately intertwisted around said core; and secondly in that said intertwisted wire is bonded by impregnating it with solder thereby imparting greater toughness thereto.

Thirdly, the invention is further characterized in that the superconducting elementary wires and high purity Al wire are intertwisted into a required configuration, the intertwisted wire being immersed in and impregnated with solder prior to a pressing process, thereby improving the adhesion between the elementary wires, and fourthly in that the elementary wire is substantially subjected to a heat treatment to recover the residual resistivity ratio of Al.

According to the invention, as described hereinbefore, since the surface of the superconducting elementary wire and that of the high purity Al wire are bonded to each other by solder impregnation, the intertwisted wire can be subjected to a reduction process without the risk of breaking the high purity Al wire; the clearance between the elementary wires being reduced by the reduction process which increases the current density. With improvement of the adhesion between the elementary wires, the superconducting material and the high purity Al wire are integrated into a complete composite material thereby enabling the intertwisted wire to have high mechanical toughness and improved electrical contact for high stability. Thus the invention enables one to produce Al-stabilized superconducting wire of light weight and high current density.

According to the invention, the surface reduction ratio of the intertwisted wire in the reduction process after solder impregnation is preferably below 40% for the following reasons.

If the reduction after solder impregnation is too heavy, the solder layer on the surface is non-uniformly distributed, whereby the texture of the elementary wire (particularly high purity Al) is occasionally exposed which results in wire breakage. Moreover, in some structures of the intertwisted wire, irregular deformation of the superconducting wires causes a degradation of critical current.

According to the invention, the surface of the superconducting elementary wire and that of high purity Al wire are preferably coated by a layer of Sn, Sn-Pb or Sn-Ag, according to the need, so as to facilitate solder impregnation and the reduction process after intertwisting.

The surface of the high purity Al in particular should be Cu-coated or covered by a plated layer of Sn, Sn-Pb or Sn-Ag so that it can be impregnated with solder by immersion.

According to the invention, the high purity Al wire preferably has a purity above 99.99% for the following reasons:

If the purity is less than 99.99%, the electroconductivity at very low temperatures is reduced and the function of the high purity Al as a stabilizer is substantially reduced to the level of Cu. Moreover, the heat treatment temperature (softening temperature) for recovering the residual resistance due to the processing distortion received during the Al wire drawing process and the reduction process after solder impregnation will be above 200° C., and the impregnated solder, in some cases, will be melted at this temperature.

According to the invention, the superconducting material, NbTi or Nb$_3$Sn, is in the state of fine multi-filaments to reduce the hysteresis loss, and the high purity Cu disposed around each of the filaments is capable of eliminating local instability. Cu alloy sleeved fine multi-superconducting wire is preferable for the outer sleeve of the superconducting elementary wire thereby enabling to cut off the coupling current between the elementary wires.

The superconducting elementary wire may have a round, a square or any other configuration. The superconducting elementary wires and high purity Al wires after intertwisting, solder impregnation and co-working processes may also have a round, square or any other configuration.

The co-working process can be selected from among die drawing, groove rolling, and working with a roller die, or a Turk's head rolls, etc.

According to the invention, the high purity Al wire is subjected to a heat treatment for the recovery of the residual resistivity ratio since the residual resistivity ratio, since reduced due to processing distortion during the wire drawing, solder impregnation and co-working processes. Though the heat treatment conditions depend on the purity of the Al wire, the kind of solder used and the degree of processing, the conditions can be selected below the melting temperature of solder if the Al having a purity above 99.99% is used.

According to the invention, the solder for impregnation is preferably an Sn-Pb alloy solder or an Sn-Ag alloy solder in particular, though selectable from among various other materials.

The Al-stabilized superconducting wire according to the invention has the characteristics as described hereinafter in reference to the accompanying drawings.

FIG. 5 is another embodiment which respresents the high purity aluminum wires and a superconducting elementary wire wound around a core and in which the superconducting elementary wires have outer shells of a copper alloy.

FIG. 6A is similar to FIG. 5 except the wire arrangement is impregnated with solder while FIG. 6B shows a detailed sectional view of the superconducting elementary wire in FIG. 6A, including the core.

The Al-stabilized superconducting wire according to the invention will now be described in detail in respect to its mechanical toughness in respect to the drawings.

Figure 1:
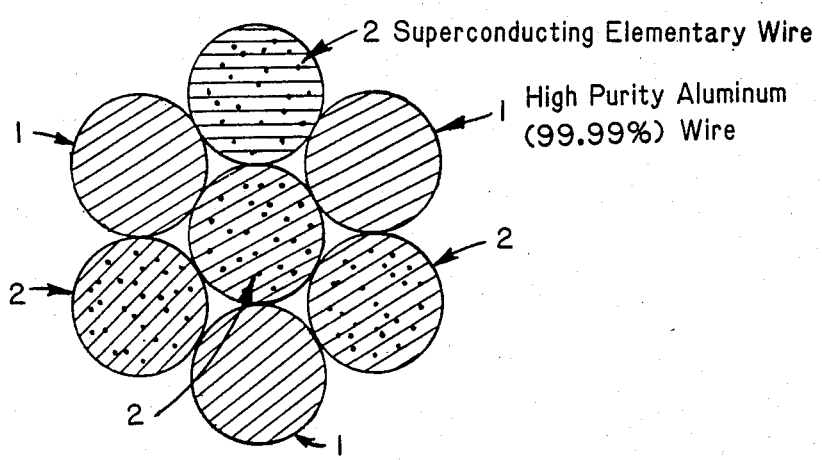
FIG. 1 is a sectional view of an embodiment of an aluminum stabilized superconducting wire according to the present invention in which the aluminum and superconducting wires are wound around a core of a superconducting wire.

In FIG. 1 high purity aluminum wires 1 and superconducting elementary wires 2 are alternately wound around a core, also designated 2, since the core is made out of the same material the superconductor elementary wire 2, to produce an aluminum stabilized superconducting wire. According to this arrangement, the high purity wires 1 are supported on three sides thereof by a material of relatively high strength, i.e. the superconducting elementary wire 2. Thus, the aluminum-stabilized superconducting composite has a greater mechanical strength against external forces, such as electromagnetic forces, etc. as compared with the case in which the whole periphery of the composite is covered by aluminum, thereby rendering the aluminum wire less susceptible to plastic deformation and makes the wire arrangement free from a decrease in electroconductivity at low temperature due to distortion.

Figure 2:
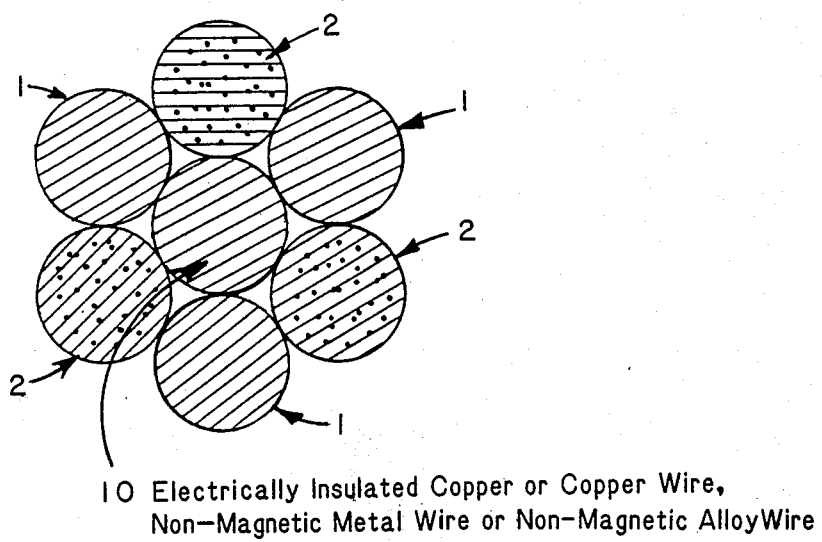
FIG. 2 is a sectional view which is the same as FIG. 1 except the core is selected from electrically insulated copper, an electrically insulated copper alloy, a non-magnetic metal or a non-magnetic alloy.

FIG. 2 shows a similar arrangement, except the core 10 is selected from electrically insulated copper, an electrically insulated copper alloy, a non-magnetic metal or a non-magnetic alloy.

Figure 3A:
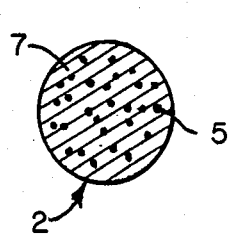
FIG. 3A is a sectional view which shows a superconducting wire component in which various filaments are embedded in a matrix.
Figure 3B:
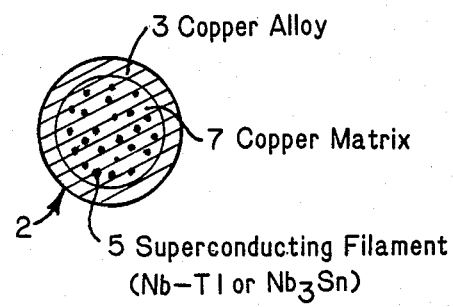
FIG. 3B is a sectional view of a superconducting elementary wire in which the individual filaments are embedded in a matrix and the matrix composite of filaments has an outer shell of a copper alloy.

The superconducting elementary wire 2 is actually composed of several filaments of superconducting wires as shown in FIGS. 3A and 3B.

In these Figures, the numeral 2 represents the superconducting elementary wire composite, whereas 7 represents a matrix, such as a copper matrix and 5 represents the superconducting filaments. In FIG. 3B, the entire filament composite is encased with an outer shell of a copper alloy 3. Thus, the superconducting elementary wires 2 in FIGS. 1 and 2 are actually made up of the individual superconducting filaments embedded in a metal matrix and FIGS. 3A and 3B are simply detailed explanations of the configuration of the element 2 in FIGS. 1 and 2.

When the superconducting elementary wire has a high resistance copper alloy shell 3 disposed between the high purity aluminum wires, the high purity aluminum wire is not only free from electromagnetic coupling, but also completely divided electromagnetically. Thus, the eddy current loss is drastically reduced. That is, coupling currents do not easily arise between the superconducting wires, since each of said wire composite has a shell 3 of high resistance copper alloy as shown in FIG. 3B. Thus, the coupling loss between the superconducting elementary wires is greatly reduced.

Figure 4:
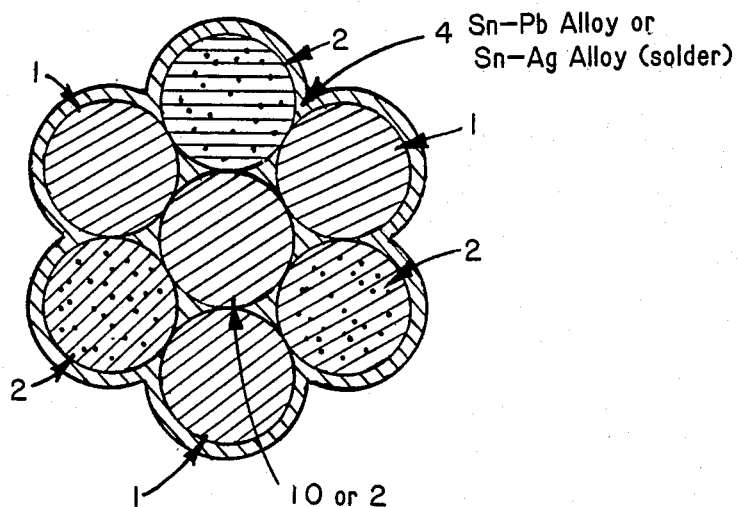
FIG. 4 is a sectional view in which the wire arrangement is impregnated with solder to bond them together.

FIG. 4 is similar to FIGS. 1 and 2, except it has been impregnated with solder (e.g. Sn-Pb alloys or Sn-Ag alloys) designated 4 therein. This solder tends to bond the superconducting elementary wires and the high purity aluminum wires together so as to form a mechanically stronger composite and to increase the electrical characteristics due to better contact as described. In FIG. 4, the core may be either made of the same structure as the superconducting elementary wire 2 or alternatively may be made of an electrically insulated copper or copper alloy, etc., 10 as shown in FIG. 2.

FIG. 5 shows an embodiment similar to FIG. 4 except that the superconducting elementary wires (2) may have outer shells of a copper-alloy 3.

FIGS. 6A and 6B represent another embodiment of the present invention. Like FIG. 5, the entire arrangement is impregnated with solder, e.g. Sn-Pb, but the superconducting elementary wire is composed of a superconducting material 5, e.g. Nb-Ti, with a Cu-Ni barrier 6 around each of the superconducting material filaments, all embedded in a copper matrix 7 and the whole composite encased with a copper-nickel outer shell 3. This corresponds to Example 1 of the present invention as will be subsequently described.

Figure 7A:
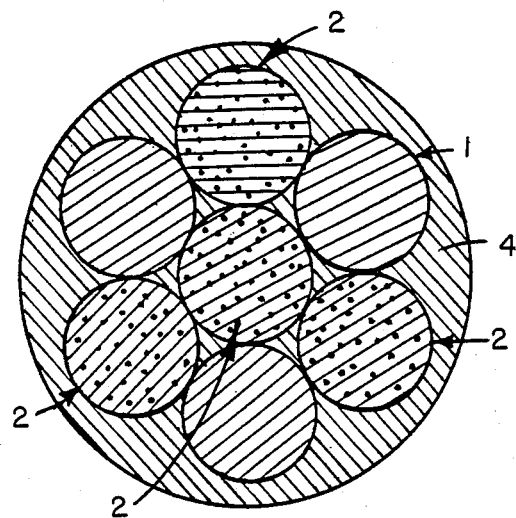
FIG. 7A represents still another embodiment of the invention and is a sectional view of a superconductor wire arrangement which is impregnated with solder and FIG. 7B shows a detailed wire of the superconducting elemental wire in which individual filaments are coated with a copper alloy, embedded in a copper matrix and the entire composite sheathed with a copper alloy outer shell.
Figure 7B:
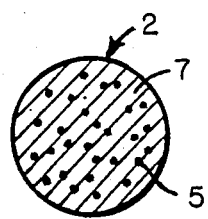

FIGS. 7A and 7B show a sectional view of a superconductor wire in which 2 represents the superconducting elementary wire, 1 the high purity aluminum, 4 represents an Sn-Pb solder, 5 represents a superconducting material, i.e. Nb-Ti, and 7 represents a copper matrix. This generally corresponds to Example 2, which will be subsequently described.

Coupling currents do not easily arise between the superconducting elementary wires, since each of said wires has a shell 3 of high resistance Cu alloy. Thus the coupling loss between the superconducting elementary wires is greatly reduced.

According to the invention, the Cu alloy constituting the superconducting elementary wire comprises alloys of CuNi, Cu-Be, etc. which can be integrated with the superconducting material, while having sufficient electrical resistance to reduce the coupling current.

Nonmagnetic metals and alloys thereof chiefly consisting of Cu alloys for use in the core of the intertwisted wire according to the invention may be selected from among such metals as will not adversely affect the mechanical and electromagnetic properties of the intertwised wire when used with the superconducting elementary wire.

More preferably, the metals have also sufficient strength to reinforce the intertwisted wire. It is necessary that the metals have sufficient electrical resistance to preclude electrical contact between the Al wires and reduce the eddy current loss.

When higher stability is taken into consideration, electrically insulated (e.g. Formal insulated) Cu is also recommendable.

Some of the superconducting wires intertwisted around the core may be replaced by electrically insulated nonmagnetic metal or alloys thereof, chiefly comprising Cu or Cu alloys, having mechanical properties substantially the same as or even higher than said superconducting elementary wire as well as an electrical resistance capable of precluding electrical contact between the Al wires.

The invention permits a still further alternative. If necessary due to the design of the conductor, a relatively high resistance Cu alloy, such as Cu-Ni, may be provided around the superconducting filaments which are surrounded by a high purity Cu capable of removing local instability, though the coupling loss is of a smaller order compared with that between superconducting elementary wires, so as to cut the interfilament coupling current. In fact, such Cu alloy sleeved mixed-matrix fine multi-filamentary wire may be used without impediment.

Though high purity Al is used as stabilizer in the invention due to its light weight, high stability and the like, it can be replaced by high purity Cu in case where such properties are not very important.

The invention will now be described in more detail in reference to the following examples.

EXAMPLE 1

Four Cu-Ni sleeved multi-filamentary superconducting elementary wires having a mixed matrix of CuNi/-Cu/NbTi, each matrix containing thirty-seven Nb-Ti filaments embedded therein and 0.3 mm $\phi$ in outside diameter, 10 mm in twist pitch, and three purity Al wires of 0.3 mm $\phi$ diameter were intertwisted into the sectional construction as shown in FIG. 1, and the whole was impregnated with solder by immersion. The Al-stabilized superconducting wire thus obtained was excited from 0 to 6 Tesla in 2 seconds and then decreased again to 0 by semicycle pulse operation. The AC loss was examined to find that the eddy current loss of Al was 0.07 J/m, while the coupling loss between the superconducting elementary wires was 0.18 J/m, smaller by more than one order compared with the case of a superconducting wire intertwisted by using a copper-sleeved superconducting elementary wire, and without dividing the Al.

EXAMPLE 2

Four superconducting elementary wires of 0.30 mm $\phi$ in outside diameter including thirty-seven Nb-Ti filaments, with an NbTi/Cu ratio of one to two, a twist pitch of 7 mm, and Pb-Sn eutectic solder-plated and three Sn plated high purity Al wires of a purity of 99.99%, which is 0.30 mm $\phi$ in outside diameter, were intertwisted into the sectional construction as shown in FIG. 2, and the whole was impregnated with a Pb-Sn eutectic solder by immersion.

The outside diameter was 0.92 mm $\phi$.

The composite wire comprising solder impregnated superconducting elementary wires and high purity Al wires were drawn to 0.82 mm $\phi$ by an ordinary wire drawing machine. The area reduction ratio was 20%. Subsequently the wire was subjected to heat treatment at 150° C. for 3 hours in order to recover the residual resistivity ratio.

In this production process, no wire breakage has occurred despite the fact that high purity Al is mechanically very weak.

The sectional view of the Al-stabilized superconducting wire thus produced shows that each of the elementary wires is in complete contact with each other with the interposition of a thin solder layer. A mechanical (tensile) test showed that the wire was completely integrated in respect to the mechanical properties.

The residual resistivity ratio of the high purity Al was about 1,000 after heat treatment, or more than four times as high as that of Cu generally used as stabilizer, three times as high in respect to the conductivity at low temperatures, and about ten times as high at 6 Tesla when the magnetic resistance effect is taken into account. Thus the high purity Al has shown to have very high properties as stabilizer.

The Al-stabilized superconducting elementary wire thus obtained has been found to have a very high stability, e.g., in which the critical current is 110A at 6 Tesla, and no nucleus-film boiling transition occurs on the surface of the superconducting conductor, even when a current 2-3 times as high as the value of critical current was supplied and further, the recovery current is greater than critical current.

The method according to the invention enables to obtain the following effects: 1. The method makes it possible to produce an Al-stabilized superconducting wire mechanically integrated and toughened by the process of intertwisting, solder impregnation and reduction, and the contact between each of the elementary wires is improved and integrated electrically.

2. The method enables one to produce in a high yield, an Al-stabilized superconducting wire capable of being reduced without the risk of breaking the high purity Al wire, and having a high packing factor, i.e., a high stability making for a higher current density.

3. The Al-stabilized superconducting wire produced by this method has a higher conductivity at low temperatures and better cooling properties compared with Cu, since a high purity Al wire above 99.99% can be used. Thus, it is not only effective as a stabilizer, but also highly economical since heat treatment for recovering the decline of conductivity at low temperature due to processing is practicable below the melting point of the solder.

4. The use of Al makes it possible to reduce the weight without deteriorating the properties of the superconducting wire.

In fact, the Al-stabilized superconducting wire according to the invention has been found to have high stability, low AC loss, light weight and high mechanical properties. The invention make it now possible to produce said Al-stabilized superconducting wire on an industrial and economically feasible basis.

What is claimed is:

1. An aluminum-stabilized superconducting wire consisting essentially of superconducting elementary wires and high purity aluminum wires alternately wound around a core so that said superconducting elementary wires and high purity aluminum wires are in contact with each other, said aluminum wire having high aluminum purity of about 99.99% and above, said core being selected from the group consisting of a superconducting elementary wire, an electrically insulated copper wire, an electrically insulated copper alloy wire, a nonmagnetic metal wire and a nonmagnetic metal alloy, said aluminum wires serving as a stabilizer in said wire arrangement and wherein the entire wire arrangement is impregnated with solder to bond the wound wires together, said impregnated wire arrangement characterized by having high mechanical toughness and improved electrical contact for greater electrical stability and wherein the risk of breakage of the aluminum wire is greatly reduced in a subsequent working process as a result of said impregnated wire arrangement.

2. An aluminum-stabilized superconducting wire as claimed in claim 1 in which the superconducting wires are fine multi-filamentary superconducting elementary wire strands embedded in a matrix and the entire strand assembly encased with an outer shell of a copper alloy.

3. An aluminum-stabilized wire according to claim 1 in which the superconducting elementary wires are composed of fine multifilamentary superconducting elementary wire strands.

4. An aluminun-stabilized superconducting wire as claimed in claim 1 in which the superconducting wire is composed of an alloy selected from the group consisting of Nb-Ti, and intermetallic compounds of $Nb_3Sn$.

5. An aluminum-stabilized superconducting wire according to claim 1 wherein the core essentially consists of a superconducting elementary wire.

6. An aluminum-stabilized superconducting wire as claimed in claim 5 wherein the core is made essentially of Nb-Ti.

* * * * *